(12) United States Patent
Hegde et al.

(10) Patent No.: US 9,863,036 B2
(45) Date of Patent: Jan. 9, 2018

(54) WAFER STAGE FOR SYMMETRIC WAFER PROCESSING

(71) Applicant: Plasma-Therm NES LLC, St. Petersburg, FL (US)

(72) Inventors: Sarpangala H. Hegde, Fremont, CA (US); Vincent Lee, Fremont, CA (US); Peter Goglia, Alamo, CA (US)

(73) Assignee: Plasma-Therm NES LLC, St. Petersburg, FL (US)

( * ) Notice: Subject to any disclaimer, the term of this patent is extended or adjusted under 35 U.S.C. 154(b) by 459 days.

(21) Appl. No.: 14/697,441

(22) Filed: Apr. 27, 2015

(65) Prior Publication Data

US 2015/0307986 A1 Oct. 29, 2015

Related U.S. Application Data

(60) Provisional application No. 61/984,600, filed on Apr. 25, 2014.

(51) Int. Cl.
| | |
|---|---|
| *B23P 11/00* | (2006.01) |
| *C23C 14/50* | (2006.01) |
| *C23C 14/22* | (2006.01) |
| *H01J 37/30* | (2006.01) |
| *H01J 37/20* | (2006.01) |

(52) U.S. Cl.
CPC .......... *C23C 14/505* (2013.01); *C23C 14/221* (2013.01); *H01J 37/20* (2013.01); *H01J 37/30* (2013.01); *H01J 2237/20207* (2013.01); *H01J 2237/20228* (2013.01); *H01J 2237/3142* (2013.01); *H01J 2237/3151* (2013.01)

(58) Field of Classification Search
CPC .... B23Q 1/03; B23Q 1/25; B23Q 3/06; B23P 19/00; B23P 19/10
See application file for complete search history.

(56) References Cited

U.S. PATENT DOCUMENTS

| 4,637,869 A * | 1/1987 | Glocker | C23C 14/0052 136/258 |
|---|---|---|---|
| 4,836,905 A * | 6/1989 | Davis | C23C 14/50 118/719 |
| 2010/0244350 A1* | 9/2010 | Fujisato | C23C 14/50 269/289 R |
| 2015/0307986 A1* | 10/2015 | Hegde | H01J 37/30 156/345.4 |
| 2017/0115555 A1* | 4/2017 | Hofmann | G03F 1/22 |

* cited by examiner

*Primary Examiner* — Lee D Wilson
(74) *Attorney, Agent, or Firm* — Burr & Forman LLP; Harvey S. Kauget

(57) ABSTRACT

A planetary arm coupled to a tilt actuator moves a wafer in oscillatory motion along an arcuate path to expose a surface of the wafer to an incident ion beam for deposition and/or etching processing of thin film structures on the surface of the wafer. A wafer holder on an end of the planetary arm may be driven in rotation while the planetary arm executes oscillatory motion at a selected tilt angle relative to an incident ion beam. A slit support plate provides controllable exposure of the wafer to the incident beam. Embodiments are suitable for use in wafer deposition machines and/or wafer etching machines.

20 Claims, 19 Drawing Sheets

VIEW C - C

SECTION B - B

SECTION B - B

SECTION B - B

SECTION B - B

WAFER STAGE FOR SYMMETRIC WAFER PROCESSING

CROSS REFERENCE

This application claims priority to U.S. Provisional Patent Application No. 61/984,600, filed on Apr. 25, 2014, incorporated herein by reference in its entirety.

FIELD OF THE INVENTION

Embodiments are related in general to apparatus for processing wafers by etching and/or deposition and more specifically to apparatus for moving a wafer while the wafer is being exposed to a beam of particles for etching and/or deposition of thin film structures on the wafer.

BACKGROUND

Wafers of solid material may have surfaces processed by deposition and/or etching. For example, semiconductor devices, electrical conductors, magnetic transducers, radio-frequency circuit elements, lenses, mirrors, and other optical components, and other three-dimensional physical structures on a wafer may be shaped by depositing thin films of material on a surface of the wafer and etching the thin films to selectively remove material. During deposition, a beam from an ion source removes material from a target placed in the beam's path. Some of the material removed from the target by the beam deposits on the wafer to form structures on the wafer's surface. Material may deposit more rapidly on sides of a structure facing the beam than on sides of a structure in the beam's shadow. During etching, a beam of energetic particles emitted from an ion source is incident upon the wafer, leading to removal of material from those parts of the wafer exposed to the beam. Masks may be applied to the side of the wafer being processed to control rates of deposition or etching.

For some wafer processing operations it is important that thin films be deposited and/or etched to a condition of uniform thickness on all sides of structures formed on the wafer. The sides of structures being formed on the wafer may be referred to as "facets". Facets may face in almost any direction relative to the propagation direction of the incident beam. A facet may be evenly exposed to a beam arriving from some directions but shadowed from the beam from other directions. Rotating a wafer during deposition and etching operations has been used to improve uniformity in rates of deposition or etching for all exposed facets. Tilting a wafer at an angle to an incident beam has also been used to improve uniformity in features formed from thin films. Some systems have further combined linear scan of a wafer with wafer rotation and wafer tilt. A linear scan is performed by carrying a wafer back and forth along a linear track, possibly while the wafer is being rotated at a selected tilt angle. However, in previously known systems with linear scan features, the angle of the linear track is held at a fixed angle relative to the walls of the vacuum chamber while the tilted, rotating wafer traverses back and forth along the track.

Uniform rates of etching and deposition contribute to uniform thin film thickness on facets facing any direction at any position on the face of the wafer. Wafer rotation, wafer rotation with tilt, and wafer rotation with tilt and linear scan may improve uniformity of thin film structures in some directions relative to an incident beam but direction-dependent and position-dependent variations in film thickness still occur. For example, even when all three of these wafer motions are combined, shadowed areas will still be found near thin film structures projecting upward from the wafer surface, and the shadowed areas will have different shadow lengths and thin film thickness for features facing one direction compared to another direction and for features near the center of a wafer compared to features near an wafer edge. Shadow asymmetry and thickness variations occur in part because the beam emitted from an ion source spreads out, or diverges, at an angle to the beam's propagation direction. Beam divergence causes local variations in deposition and etching rates at the surface of the wafer. A beam may have radial variations in intensity and possibly other sources of variation that contribute to variations in rates of deposition and etching at different locations on a wafer. Variations in deposition and/or etching from beam divergence may be radially dependent, that is, variations in thin film deposition thickness or etching depth may be greater near the outer peripheral edge of a wafer than near the center of rotation of the wafer. Collimating the beam to reduce the beam divergence angle may reduce such variations, but collimation is difficult and expensive to implement with the accuracy needed to fabricate sub-micron-sized structures on wafers that larger than about 150 millimeters in diameter.

Thin film thickness variations caused by beam divergence may be reduced by forming a beam with a diameter greater than a diameter of the wafer being processed. The size, weight, control system complexity, operating cost, and expense of the ion source needed to produce such a beam increases with an increase in wafer diameter. The larger the ion source, the more difficult it is to produce a beam with uniform beam density distribution, uniform local beam divergence, and energy distribution across the width of the beam, that is, in a direction normal to the beam propagation direction. For example, a large-diameter beam may be formed from a group of smaller "beamlets" propagating in a common direction. Individual beamlets may have variations in beam density distribution, beam divergence, and energy compared to one another. Such variations across the width of the beam contribute to variation in rates of thin film deposition or etching.

SUMMARY

An example of an apparatus embodiment includes a tilt actuator; a planetary arm rotatably coupled to the tilt actuator; a slit support plate attached to the tilt actuator; a wafer holder rotatably coupled to the planetary arm; and a planetary scan actuator attached to the tilt actuator and to the planetary arm. The planetary arm and the slit support plate are rotatable to a selected tilt angle by the tilt actuator and the planetary arm is movable along an arcuate path by the planetary scan actuator.

The planetary scan wafer stage may further include a wafer rotation drive attached to the planetary arm, wherein the wafer rotation drive is coupled to the wafer holder for rotation of the wafer holder.

The arcuate scan path is preferably a circular arc of constant radius. An oscillatory motion of the planetary arm along the arcuate path and a rotational motion of the wafer holder are capable of coordinated rotation for symmetric processing of thin film structures on a wafer workpiece held in the wafer holder.

The tilt actuator includes a stationary collar and a core rotatably coupled to the collar. The planetary arm includes an arm hub rotatably coupled to the core. The planetary scan actuator and slit support plate are also attached to the core.

BRIEF DESCRIPTION OF THE DRAWINGS

FIG. 2 further represents an example of an apparatus configured to perform deposition operations on a wafer attached to the planetary scan wafer stage.

FIG. 22 further represents an example of an apparatus capable of performing deposition and etching operations on a wafer attached to the planetary scan wafer stage.

DESCRIPTION

An embodiment comprises an apparatus for moving a wafer in a wafer processing machine. An embodiment includes a planetary scan wafer stage having a rotatable wafer holder coupled to an oscillating planetary arm and a slit support plate through which a beam of particles passes before striking a wafer held in the wafer holder. The planetary scan wafer stage further includes a tilt actuator for rotating the planetary arm and slit support plate together to a selected tilt angle relative to a propagation direction for a beam of particles incident upon the wafer. The planetary arm sweeps the wafer holder back and forth in oscillatory motion along an arcuate path, exposing a wafer in the wafer holder to the portion of the beam passing through the slit support plate. The slit support plate is held stationary relative to the beam while the wafer rotates on the end of the oscillating planetary arm. Oscillatory motion of the planetary arm refers to a repeatable cyclic motion of the planetary arm between two endpoints of an arcuate path, where the arm reverses its direction of motion along the arcuate path after reaching an endpoint of the arc.

A planetary scan wafer stage embodiment is suitable for use in a wafer processing machine adapted for wafer deposition, wafer etching, or both deposition and etching in a same machine. An apparatus in accord with an embodiment is capable of processing thin film structures on a wafer with less variation in film thickness and less asymmetry compared to previously known devices. Embodiments are therefore advantageous for fabricating sub-micron-size structures on wafers at higher yields than may be attainable with previously known equipment. A wafer processing machine in accord with an embodiment may take advantage of the higher degree of symmetry and lower magnitude of variation in the thickness of thin film structures formed on a wafer by using a smaller, lighter, lower-power, and less-expensive ion source than ion sources used in previously known systems.

Figure 1:
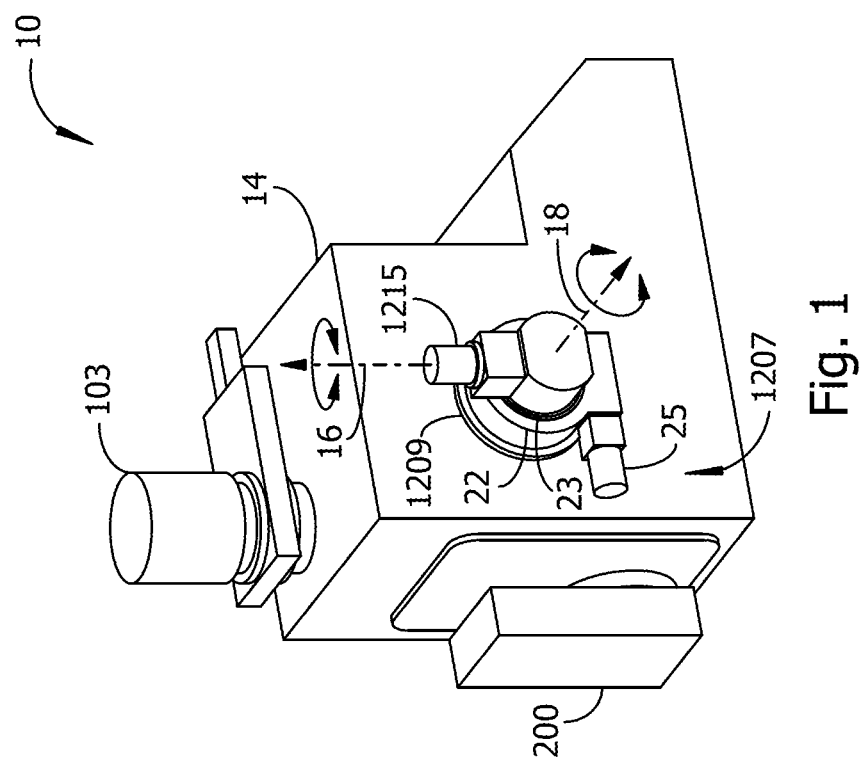
FIG. 1 illustrates an example of a wafer processing apparatus in accord with an embodiment, for example a wafer deposition apparatus, a wafer etching apparatus, or an apparatus capable of performing both deposition and etching.

FIG. 1 shows an example of a wafer processing machine in accord with an embodiment 10. The example of a wafer processing machine in FIG. 1 includes an ion source 200 and a vacuum pump 103 with a shutoff valve coupled to an enclosure 14 containing a vacuum chamber. A tilt actuator 1207 rotates equipment in the vacuum chamber through a port 1209 passing through a wall of the enclosure 14. The tilt actuator 1207 includes a tilt actuator motor 25 attached to a stationary collar 22. The collar 22 is attached to the enclosure 14 for the vacuum chamber. A core 23 rotates about a tilt rotation axis 18 within the collar 22 under the influence of the motor 25. A planetary scan actuator 1215 is attached to and rotates with the core 23 of the tilt actuator 1207. The planetary scan actuator 1215 drives a planetary arm and other components inside the vacuum chamber in oscillator motion about a scan rotation axis 16 as will be explained in more detail below. The stationary collar 22 for the tilt actuator forms an airtight seal against the enclosure 14 and prevents leakage of fluid and gas into the vacuum chamber while a wafer is being processed.

Figure 2:
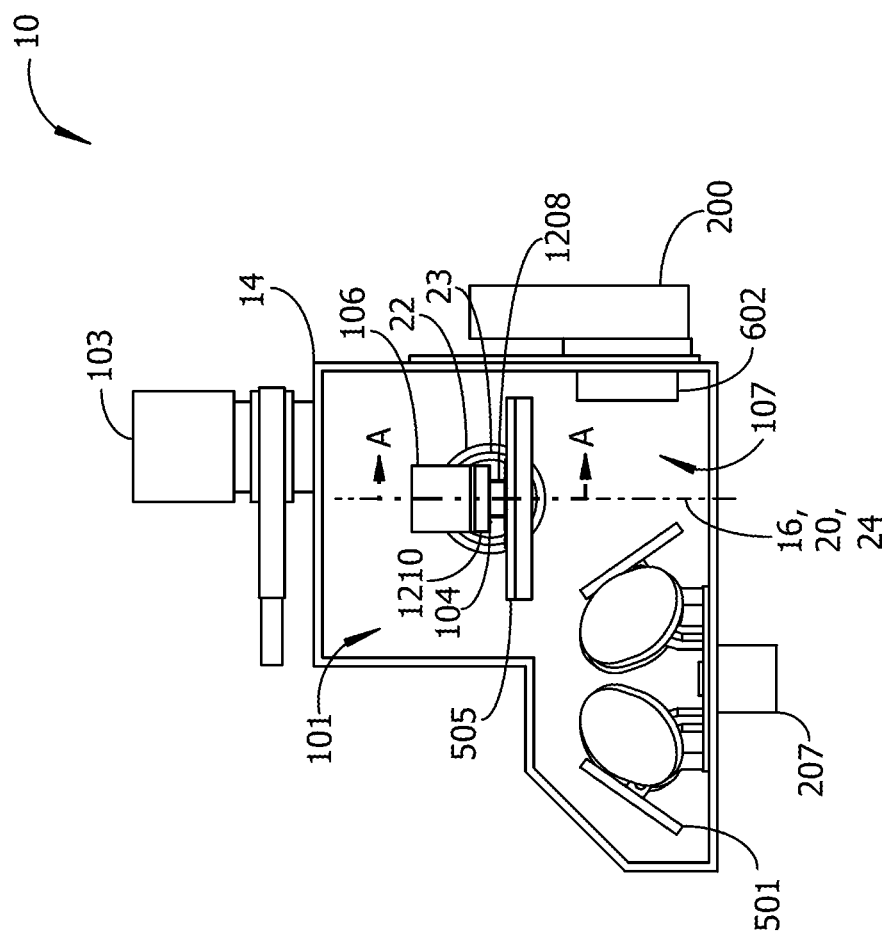
FIG. 2 shows a side view of the apparatus from the example of FIG. 1, with a part of the enclosure removed to show an example of a planetary scan wafer stage and other components in a vacuum chamber.

FIG. 2 continues the example of an embodiment 10 from FIG. 1, showing examples of components inside the vacuum chamber 107 contained within the enclosure 14. The ion source 200 includes an output stage 602 for directing a beam of ions into the vacuum chamber. During wafer etch, the beam of ions may propagate directly toward a surface of the wafer to remove material from the wafer. During deposition, the beam of ions may first impact on a target comprising material for deposition on a wafer, and a beam including particles of deposition material traverses toward the wafer. Such beams may be described by a beam propagation direction and a beam divergence angle.

Figure 7:
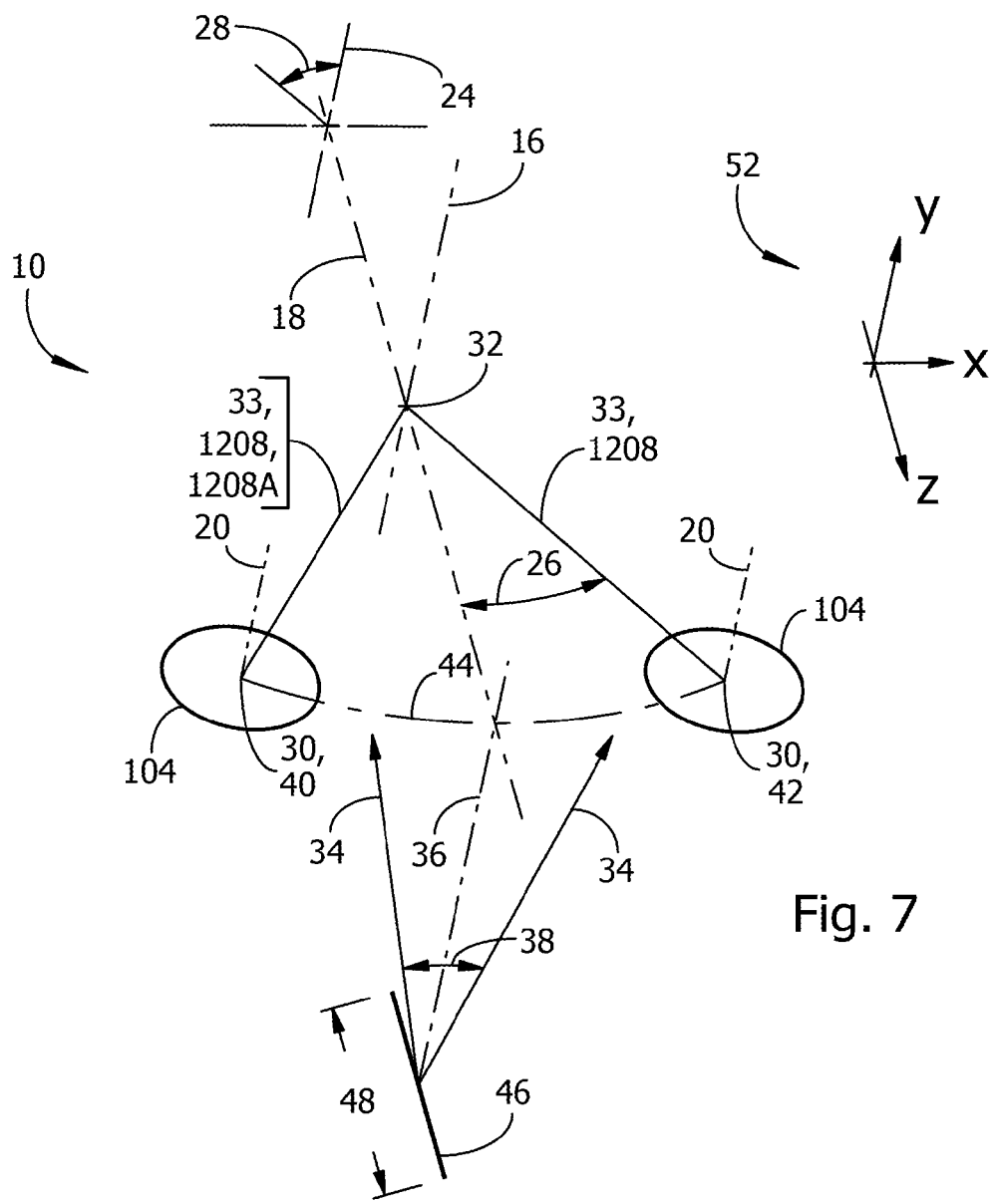
FIG. 7 illustrates a three-dimensional diagram of directions and angles for understanding operation of an embodiment.
Figure 11:
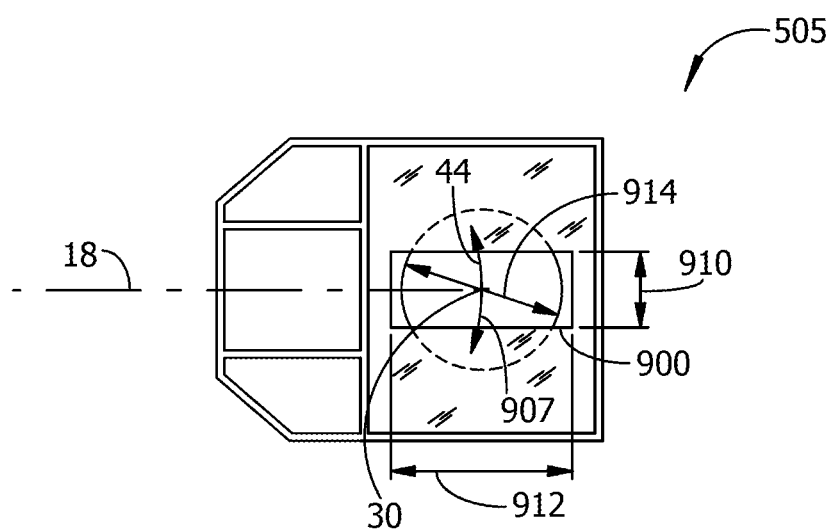
FIG. 11 shows a view toward the underside of an example of a slit support plate, with an example of a wafer visible through a rectangular aperture formed in the plate.

In a wafer processing machine adapted for deposition, more than one target 501 may optionally be mounted on a rotatable target drive 207 for exposing a selected target to an ion beam output from the ion source 200. In a preferred embodiment of a machine for wafer deposition, the output stage 602 of the ion source 200 focuses the beam output from the ion source 200 to a line image on the selected target 501. A beam formed to a line image reduces thickness variations in thin film structures on a wafer in a direction parallel to a longest dimension of a beam aperture 1001 on the slit support plate (ref. FIG. 7, FIG. 11, and related discussion).

An example of a planetary scan wafer stage 101 in FIG. 2 includes a planetary arm 1208 and a slit support plate 505 attached to the rotatable core 23 of the tilt actuator 1207. The collar 22 of the tilt actuator 1207 is adapted for strong attachment to the enclosure 14 and preferably remains stationary with respect to the enclosure. The core 23 rotates coaxially within the collar 22. The planetary arm 1208 and slit support plate 505 rotate together to a selected tilt angle by operation of the tilt actuator 1207. A wafer holder 1210 near an end of the planetary arm 1208 is adapted to securely hold a wafer 104 during processing. The wafer holder 1210 is rotatable about a wafer rotation axis 20 by a wafer rotation drive 106. The wafer rotation axis 20 preferably passes through a center of rotation on a face to be processed on the wafer 104, in a direction normal to the wafer face. In the example of FIG. 2, the tilt actuator has positioned the wafer rotation axis 20 and the scan rotation axis 16 parallel to a vertical reference direction 24. Although the wafer rotation axis 20 and scan rotation axis 16 are superimposed from the viewing direction of FIG. 2, these two rotation axes are separated from one another at opposite ends of the planetary arm 1208.

Figure 3:
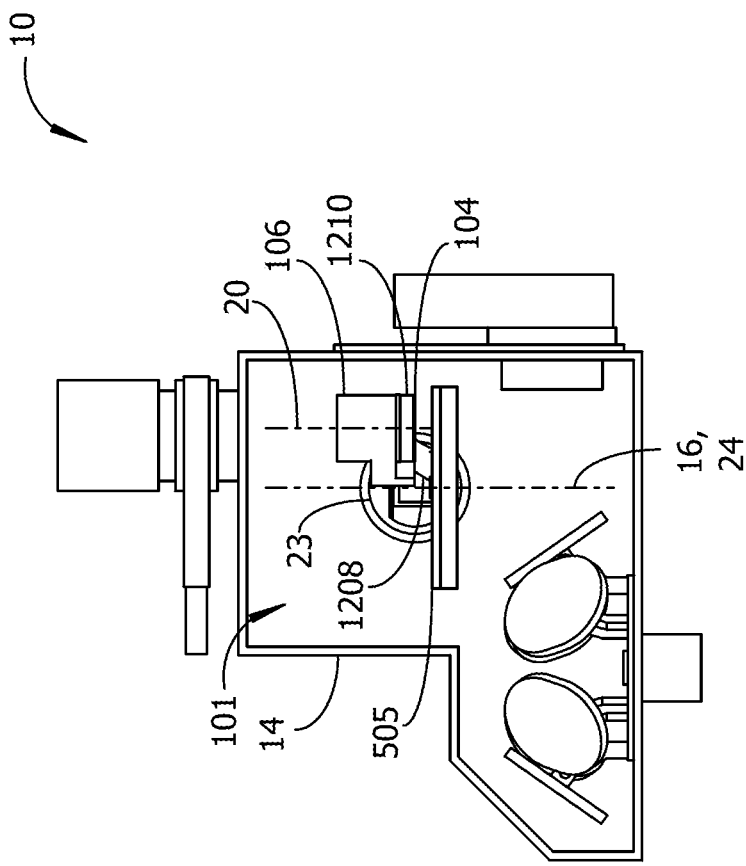
FIG. 3 shows an example of a planetary arm positioned at an end of an arcuate scan path, compared to the position of the arm shown in FIG. 2.
Figure 4:
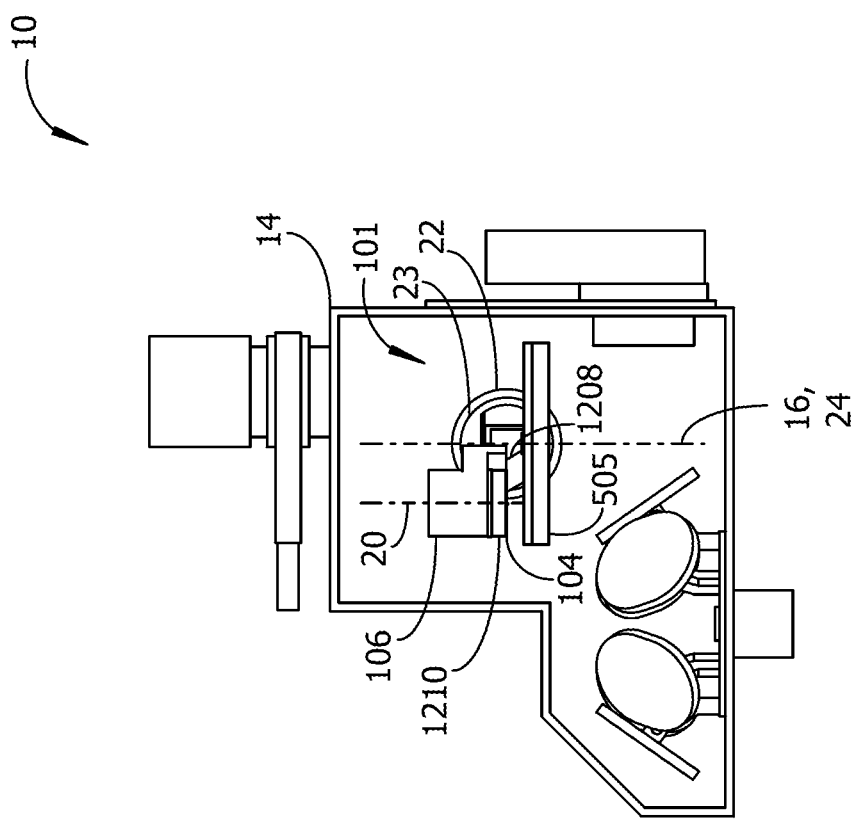
FIG. 4 shows an example of the planetary arm positioned at an opposite end of the arcuate scan path, compared to the position of the arm in FIG. 3.

During operation of the wafer processing machine, the planetary arm 1208 scans the rotating wafer 104 back and forth above the slit support plate 505, moving the wafer holder and wafer in an oscillatory motion along an arcuate path inclined at the tilt angle determined by the tilt actuator 1207. FIG. 3 shows an example of the planetary scan wafer stage 101 with its planetary arm 1208 at an end of its arcuate path. Compared to FIG. 2, the planetary arm has moved to the right in FIG. 3. Comparing FIGS. 2 and 3 shows that the slit support plate 505 does not oscillate with the planetary arm, the slit support plate being fixed to the core 23 of the tilt actuator 1207. FIG. 4 continues the example of FIG. 2 and FIG. 3, showing the planetary arm at an opposite end of its arcuate path. Compared to FIG. 2 and FIG. 3, the planetary arm 1208 has moved to the left in FIG. 4. As suggested in FIGS. 2-3, the wafer rotation axis 20 is positioned at an end of the planetary arm opposite the end through which the scan rotation 16 axis passes.

The arcuate path followed by the rotational center of the wafer during oscillatory motion of the planetary arm is preferably an arc of constant radius, i.e., a circular arc. This differs from previously known systems which may cause a wafer carrier to traverse back and forth along a linear track. Another difference is that the linear track in any previously known system remains in a fixed position, and the straight-line path followed by a traversing wafer is therefore inclined at a fixed angle relative to a stationary structure such as the enclosure. In contrast to previously known systems, an embodiment is capable of tilting the plane of the arcuate path followed by the wafer to any angle within the operating range of the tilt actuator, while simultaneously rotating the wafer and sweeping the wafer along the arcuate path.

Figure 5:
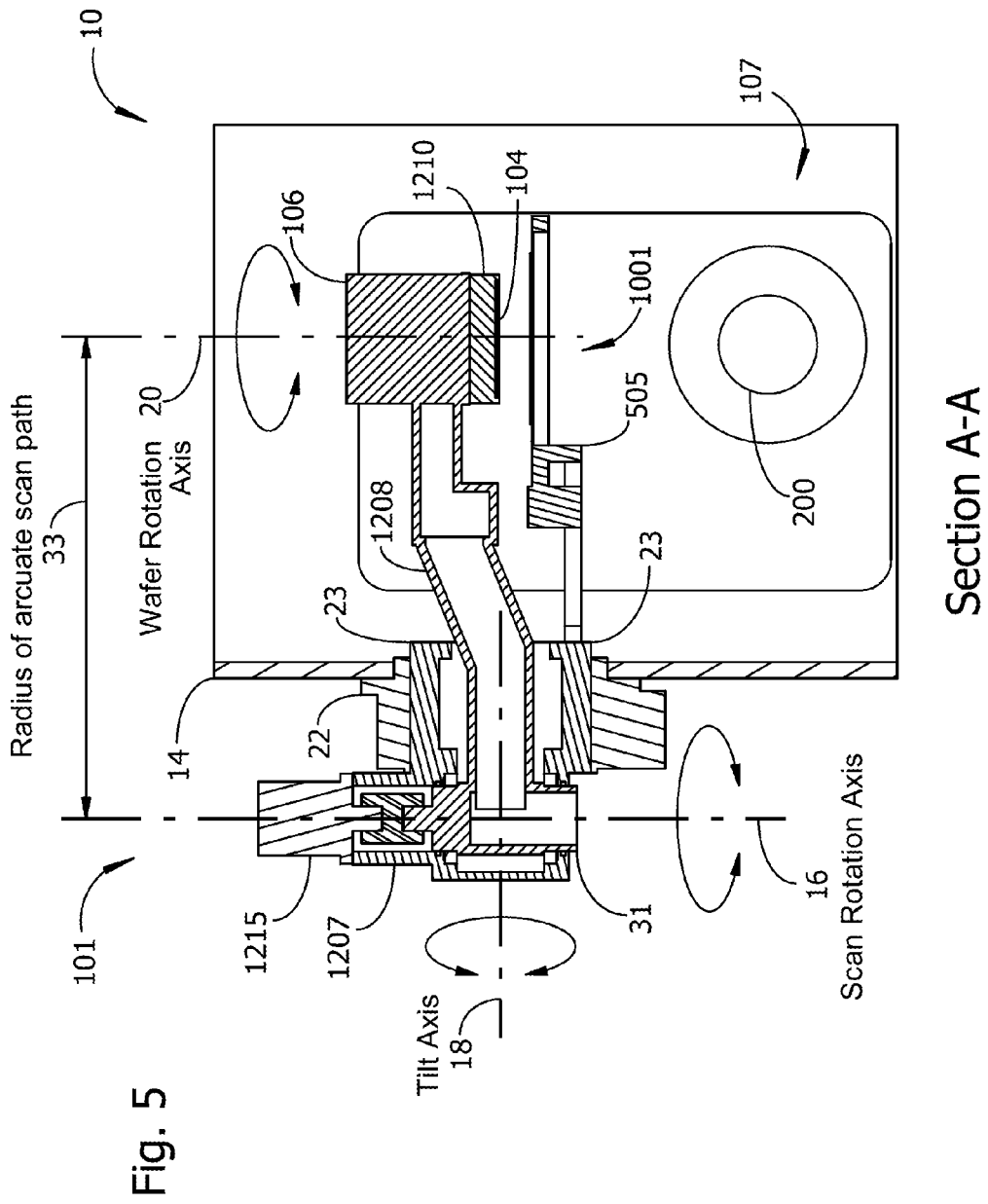
FIG. 5 shows a cross-sectional view A-A of an example of a planetary scan wafer stage. A location and viewing direction for view A-A is marked in FIG. 2.

FIG. 5 shows a cross section A-A with some additional details of the planetary arm and other parts of the example of a planetary scan wafer stage 101 from the previous figures. In the example of FIG. 5, the planetary arm 1208 protrudes into the vacuum chamber 107 through a port 1209 formed in a wall of the vacuum chamber. The planetary arm includes an arm hub 31 at one end and at an opposite end a wafer holder 1210 driven in rotation by a wafer rotation motor 106. The wafer holder is adapted to securely hold a wafer during deposition and/or etching of thin film structures on the wafer. The wafer is an example of a work piece held by an embodiment and is not part of an embodiment. The arm hub is rotatably coupled to the core 23 and is driven in oscillatory motion about a scan rotation axis 60 by the planetary scan actuator 1215, which may be a stepper motor or another form of electric motor. The slit support plate 505 is also attached to the core 23. A beam incident upon a wafer passes through a beam aperture 1001 formed in the wafer support plate 1001.

Rotating the core 23 to a selected tilt angle relative to the stationary collar 22 rotates the scan rotation axis 16, the wafer rotation axis 20, the arm hub 31, the planetary arm 1208, the wafer rotation drive 106, the wafer holder 1210, a wafer 104 held in the wafer holder 1210, and the slit support plate 505 to the same tilt angle. The core 23 may be tilted while the planetary arm 1208 is undergoing oscillatory motion and while the wafer 104 is being rotated about its axis 20. A separation distance 33 between the scan rotation axis 16 passing through the arm hub 31 and the wafer rotation axis 20 passing through the center of rotation of the wafer 104 corresponds to a radius 33 of the arcuate scan path followed by the planetary arm 1208.

Figure 6:
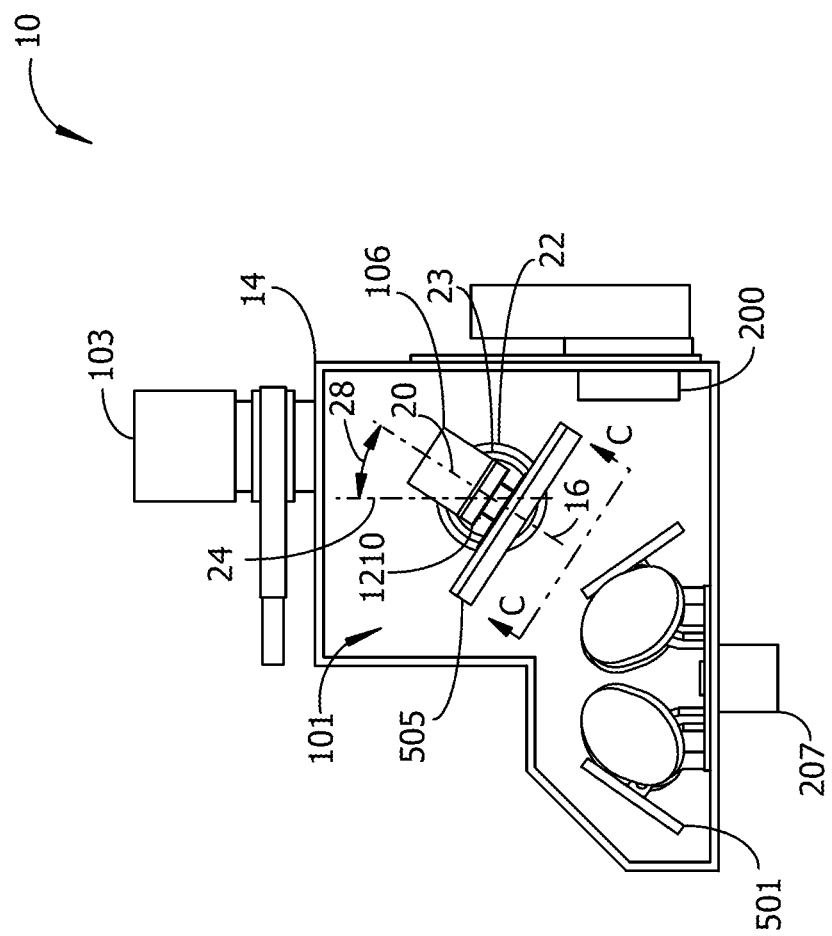
FIG. 6 illustrates an example of a tilt angle for a planetary scan wafer stage.

FIG. 6 illustrates an example of a planetary scan wafer stage 101 rotated to a tilt angle 28 by operation of the tilt actuator 1207. The tilt angle in the example of FIG. 6 is measured with respect to a vertical reference 24, but may alternatively be measured with respect to the propagation direction of a beam of particles and/or electromagnetic energy incident upon a wafer held in the wafer holder at the end of the planetary arm.

Motions imposed on a wafer work piece by an embodiment are represented by a geometric diagram in FIG. 7. Directions are referenced to three mutually orthogonal spatial axes 52, for example an x axis, a y axis, and a z axis oriented as shown. In the example of FIG. 7, the scan rotation axis 16 passes through a planetary arm pivot point 32 for the arm hub. In the example of FIG. 7, the scan rotation axis is parallel to the y axis, perpendicular to the tilt rotation axis 18, and is shown for a tilt angle 28 equal to zero. The scan rotation axis remains perpendicular to the tilt rotation axis at any tilt angle 28 relative to a vertical reference direction 24. The planetary arm 1208 scans the wafer 104 through a scan angle 26, with the center of rotation 30 of the wafer 104 moving along an arcuate path 44 from an end of the scan arc 40 to an opposite end of the scan arc 42. The radius 33 of the arcuate path 44 is preferably constant along the entire length of the arcuate path. The scan angle 26 is selected to cause the entire face of the wafer being processed to sweep all the way from one side of the beam aperture on the slit support plate to the other side of the beam aperture (ref. FIG. 12). The scan angle 26 therefore depends in part on the wafer's diameter and the width of the beam aperture.

The wafer rotation axis 20 passes through the wafer center of rotation 30 and is shown parallel to the y axis in FIG. 7. The tilt actuator can be operated to tip the wafer rotation axis away from being parallel to the y axis. In some embodiments, the wafer rotation axis and the scan rotation axis may optionally be tilted to a nonparallel condition relative to one another. The arcuate path 44 lies in a plane defined by the path endpoints (40, 42) and the planetary arm pivot point 32. Rotating the planetary arm to a selected tilt angle 28 causes a corresponding rotation of the plane of the arcuate path, the wafer, the slit support plate, and the wafer rotation axis.

An ion beam emitted from the output staged of an ion source is preferably focused to a line image 46 having a length 48. The length 48 of the line image 46 is preferably at least as long as the longest linear dimension of a slit on the slit support plate 505 (ref. FIG. 11). The beam 34 incident on the wafer 104 propagates in a direction 36 that preferably intersects the tilt rotation axis 18. The beam 34 has a divergence angle 38 everywhere along the length 48 of the line image 46. Whereas scanning the wafer across a width dimension of the slit improves thin film thickness uniformity and symmetry in the direction of the width of the slit, corresponding to the direction along the arcuate path 44, forming the beam 34 into a line image 46 improves thin film uniformity and symmetry in a direction parallel to the length of the slit, i.e., a direction perpendicular to the arcuate path 44.

Figure 8:
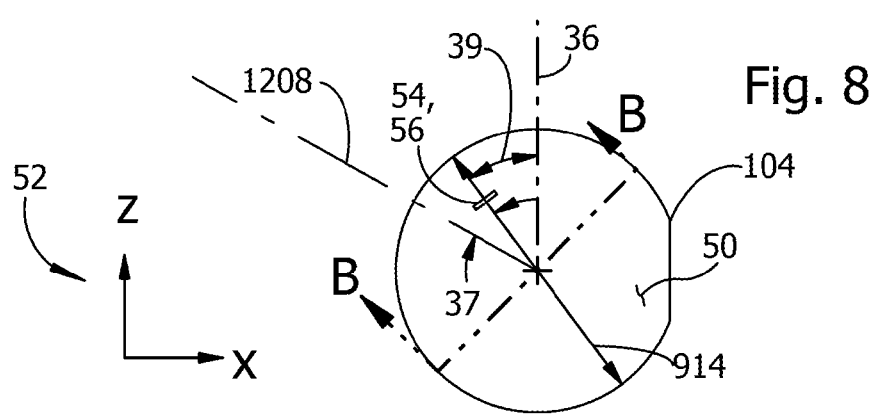
FIG. 8 shows a view toward a surface of a wafer being processed by an embodiment.

An example of a wafer 104 that may be processed with a high degree of symmetry in thin film thickness for facets everywhere on a wafer is shown in FIG. 8. As suggested in FIG. 8, a dimension 914 corresponds to a wafer diameter for a face 50 to be exposed to the beam 34 (ref. FIG. 7). A wafer rotation angle 37 may be defined as an acute angle between a selected beam diameter 914 and an axis 1208A from the planetary arm pivot point 32 to the wafer center of rotation 30.

FIGS. 7 and 8 may be used to explain an advantageous mode of operation of an embodiment. A three-dimensional wafer feature 54 having a facet 56 is shown at greatly exaggerated scale in FIG. 8. An angle 39 between the facet 56 and the beam propagation direction 36 may be defined as an acute angle 39 between a surface normal to the facet, represented by the diameter line 914. In an operating mode referred to herein as coordinated rotation, the wafer rotation angle 37 and the scan angle 26 may be controlled to keep the surface normal for the facet at a preferred angle 39 to the beam propagation direction for a selected time duration in order to achieve a preferred magnitude of deposition and/or depth of etch of a thin film structure on or near the feature 54. Features in some directions relative to the beam may selectively be exposed to the beam for a longer time than features in other directions. Coordinated rotation may adapt etch rates and deposition rates to different materials on different facets and is capable of delivering a high degree of symmetry and uniformity in thin film thickness for all facets in all directions and all locations on a wafer. Previously known systems which do not combine a scan rotation with wafer rotation and wafer tilt, or which apply a linear scan with rotation and tilt, are not capable of performing the same motion as an embodiment.

In contrast to an embodiment, previously known deposition systems focus an ion beam to a spot on the surface of a target, leading to a larger value of divergence angle for the beam incident upon a wafer and greater asymmetry in thin film structures. Previously known deposition systems may simultaneously tilt and rotate a wafer, but in contrast to the embodiments herein do not combine tilt and rotation with a scan motion of the wafer relative to a slit through which the beam passes. Unlike a planetary scan wafer stage in accord with an embodiment, previously known deposition systems may induce nonuniformity and asymmetry in thin film thickness in one or more radial directions outward from the center of a tilted, rotating wafer.

Figure 9:
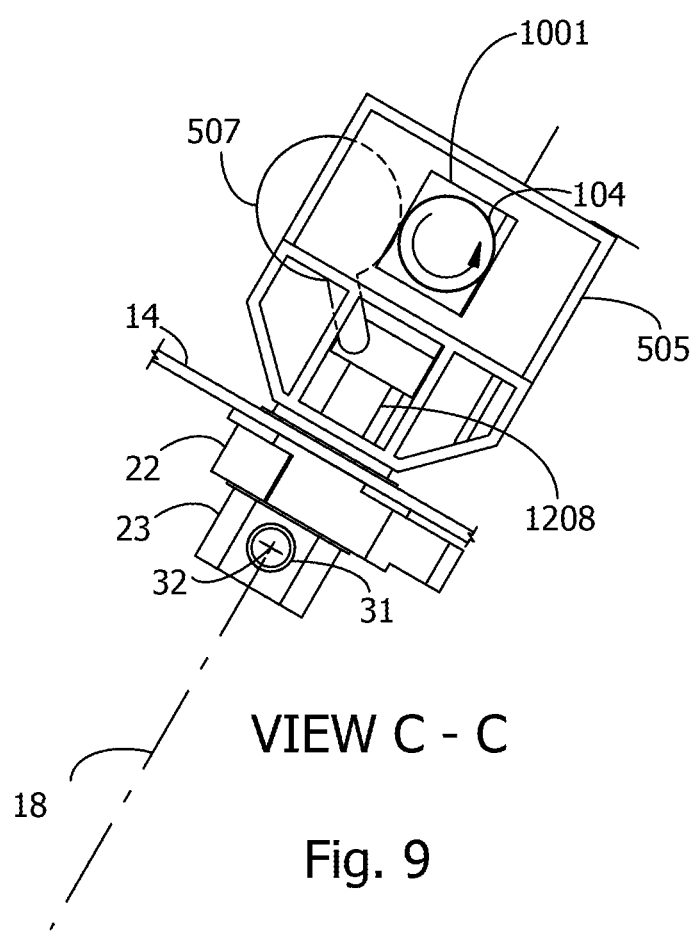
FIG. 9 shows an auxiliary view C-C toward a bottom side of a slit support plate coupled to the planetary arm, with an example of a rotating wafer visible through an aperture formed in the plate.

A view of a rotating wafer 104 is shown from the underside of a slit support plate 505 in FIG. 9. View C-C (ref. FIG. 6) shows a position of the planetary arm 1208 corresponding to a midpoint of the arcuate path 44 in FIG. 7. The planetary arm 1208 oscillates back and forth about its pivot point 32, moving the wafer through the beam passing through the beam aperture 1001 while the wafer is rotating. The beam aperture may optionally be formed with a length dimension greater than a diameter of a wafer being processed. At the instant of time represented in FIG. 9, the entire diameter of the wafer 104 is exposed to the beam passing through the beam aperture as the planetary arm oscillates back and forth. The beam aperture 1001 may be have dimensions approximately equal to the wafer diameter as suggested in FIG. 9, or may have other shapes and dimensions as discussed below. A beam aperture 1001 may be partially or entirely blocked by a shutter plate 507. The shutter plate may optionally be formed with an aperture referred to herein as a "slit", or the beam aperture may take the form of a slit. As used herein, a "slit" may refer to any size and shape of aperture through which the beam passes before impinging on a wafer.

Figure 10:
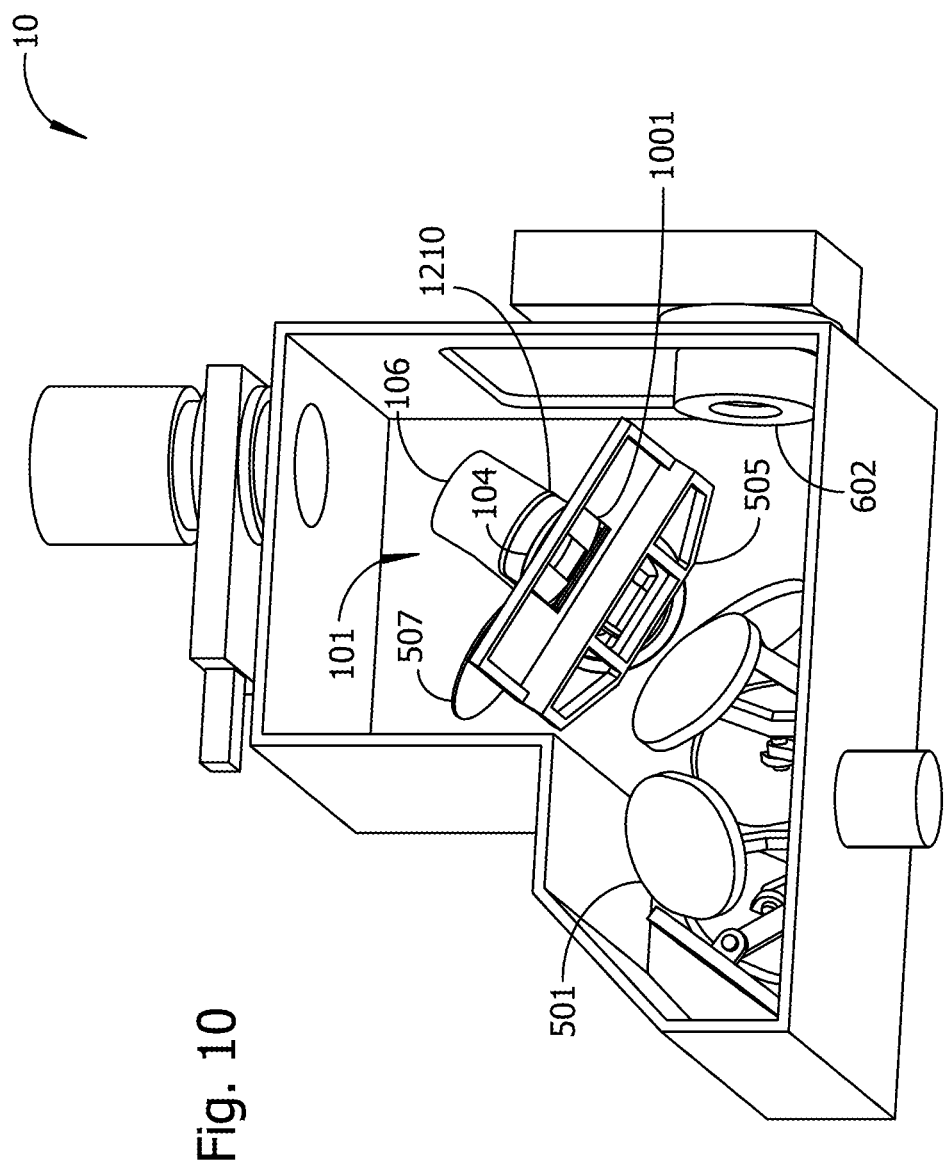
FIG. 10 shows a pictorial view toward the bottom of the slit support plate with a wafer attached to the wafer stage for processing.

A pictorial view of an example of a deposition system in accord with an embodiment 10 is shown in FIG. 10. The planetary scan wafer stage 101 has rotated to a tilt angle away from the vertical. Part of the wafer 104 is visible through the beam aperture 1001 formed in the slit support plate 505. An auxiliary wafer shutter 507 is shown in position for uncovering the beam aperture 1001, exposing the wafer 104 on the wafer holder 1210 to a deposition beam formed by an ion beam from the output stage of the ion source 200 impinging on a selected target 501.

An example of a slit support plate is shown in FIG. 11. The slit support plate 505 may optionally be formed with a generally rectangular slit 900 having a width dimension 910 and a length dimension 912. The slit 900 will preferably be positioned on the slit support plate 505 with the width 910 of the slit in the same direction as the scan direction 907 along the arcuate path 44.

Figure 12A:
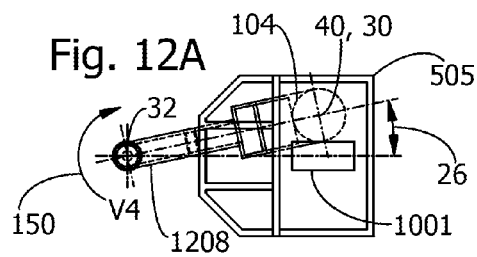
FIGS. 12A to 12I show an example of a sequence of positions of the planetary arm as the wafer is scanned across the aperture formed in the slit support plate.
Figure 12I:
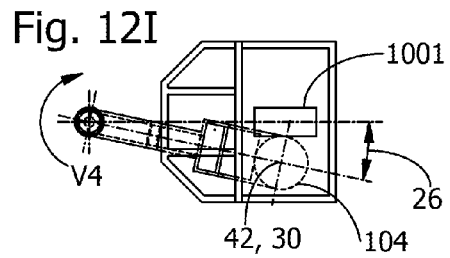
Figure 12B:
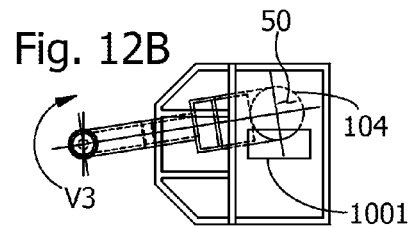
Figure 12H:
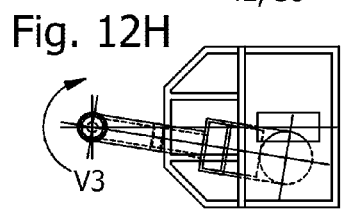
Figure 12C:
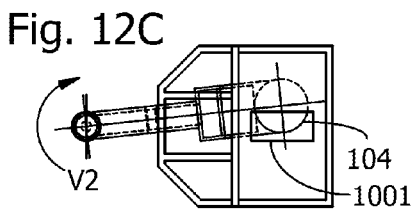
Figure 12G:
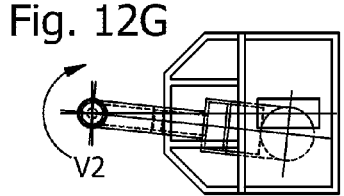
Figure 12D:
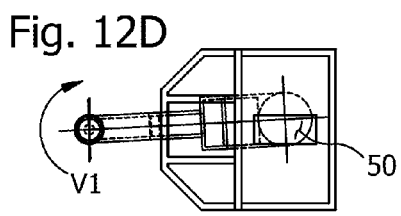
Figure 12F:
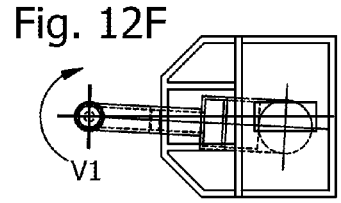
Figure 12E:
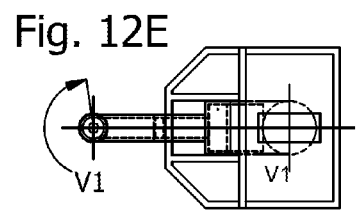

The entire face of the wafer being processed preferably passes all the way from one side of the slit to the other in the direction of the slit's width during oscillating motion of the planetary arm. FIGS. 12A-12I show an example of a sequence of wafer and planetary arm positions during a scan cycle. A scan cycle begins in FIG. 12A with the wafer 104 at an end of the arcuate scan path. None of the wafer is exposed to the beam through the slit 1001 at the start of the scan cycle. In FIGS. 12B to 12E, the rotation of the planetary arm toward the opposite end of the arcuate scan path progressively exposes more of the wafer 104 to the beam through the slit 1001. In FIG. 12E, the wafer is approximately at the midpoint of the arcuate scan path followed by the planetary arm. In FIGS. 12F to 12H, the wafer passes under the edge of the slit in the direction of the slit's width dimension, progressively shadowing more and more of the wafer until the wafer's center reaches the end of the arcuate path and none of the wafer is exposed through the slit. The planetary arm then reverses direction along the arcuate scan path, returning the wafer to the position shown in FIG. 12A to complete the scan cycle. The planetary arm may then begin another scan cycle.

An embodiment may be operated with the planetary arm moving at a constant angular velocity along the length of the arcuate path, accelerating or decelerating close to the ends of the path to reverse scan direction. Alternatively, an embodiment may be operated with different selected values of instantaneous velocity along the arcuate path, as suggested by velocity values 150 in the figures (V4 in FIG. 12A, V3 in FIG. 12B, V2 in FIG. 12C, V1 in FIG. 12D, and so on). An instantaneous velocity 150 and a rotation rate for a wafer may be chosen to cause a selected facet or group of facets on a wafer to maintain a selected angle to an incident beam for a preferred time duration during a scan cycle of the planetary arm, thereby enabling a fine degree of control over a thickness of a thin film for the selected facet.

Figure 13:
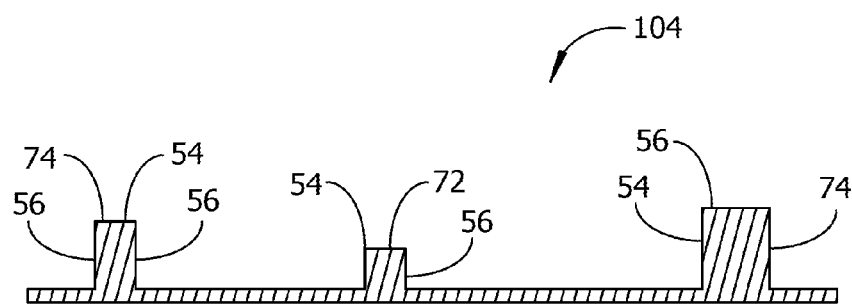
FIG. 13 shows a cross-sectional view B-B of the example of a wafer from FIG. 8.
Figure 14:
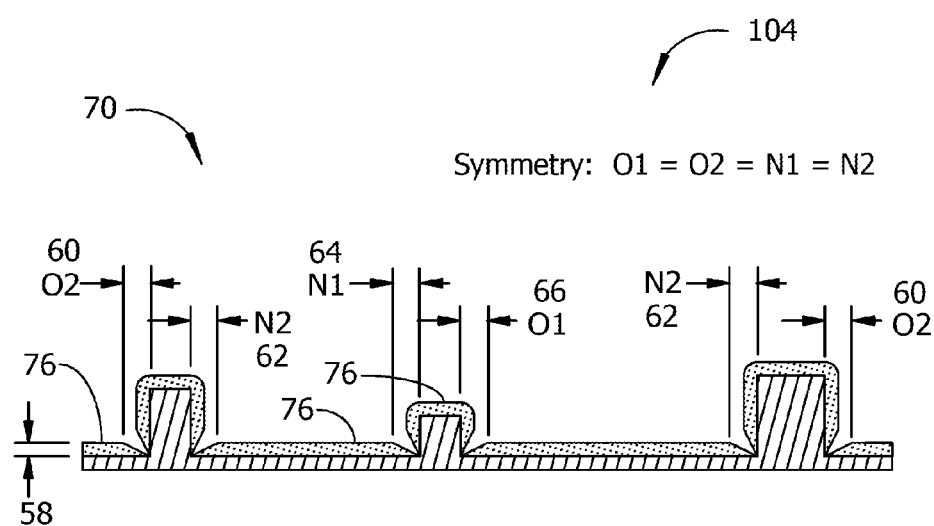
FIG. 14 shows an alternative cross-sectional view B-B, illustrating a thin film symmetrically processed to a selected film thickness on facets formed on the wafer.

FIGS. 13-16 show examples of results for a wafer processed on an embodiment. FIG. 13 represents a cross sectional view B-B from the wafer of FIG. 8, showing at greatly exaggerated scale features 54 formed on a wafer by deposition and etching. Some features 72 are close to the center of the wafer 104 while others 74 are closer to an outer peripheral edge of the wafer. Each feature includes facets 56 comprising thin film structures to be processed by deposition and/or etching with a beam. FIG. 14 shows a preferred situation in which a thin film 76 has a uniform thickness 58 almost everywhere on the wafer. Any deviations from uniform thickness are symmetric about each feature 54, without radial or directional variation in thin film thickness from one feature to another or from one facet to another. For example, partial shadowing of the beam by a feature may cause a tapered reduction in film thickness close to each feature. Such tapering, when it occurs, is preferably the same on all sides of the feature and at all radial distances from the center of the wafer. Symmetry may therefore be represented by a condition in which a length dimension of a partially shadowed outboard region O2 60 is equal to a length of any other partially shadowed outboard region O1 66, and is also equal to a length of any partially shadowed inboard regions N2 62 or N1 64. FIG. 14 represents a preferred, symmetric layer profile 70 for structures formed by deposition and etching of thin films.

Figure 15:
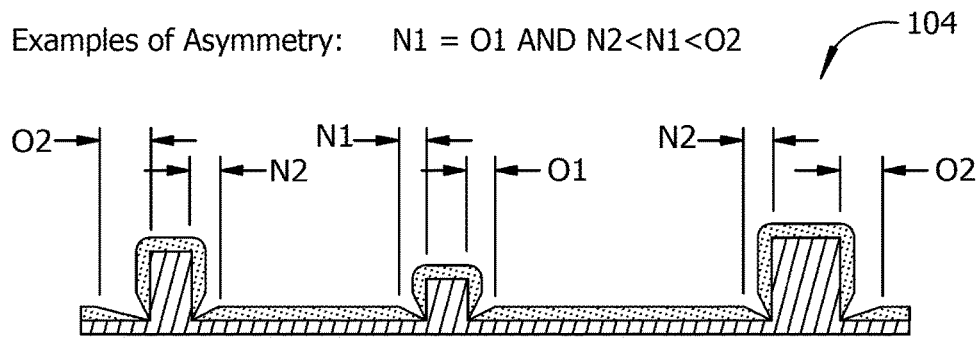
FIG. 15 shows an alternative cross-sectional view B-B, illustrating examples of asymmetry in structures formed from thin films.
Figure 16:
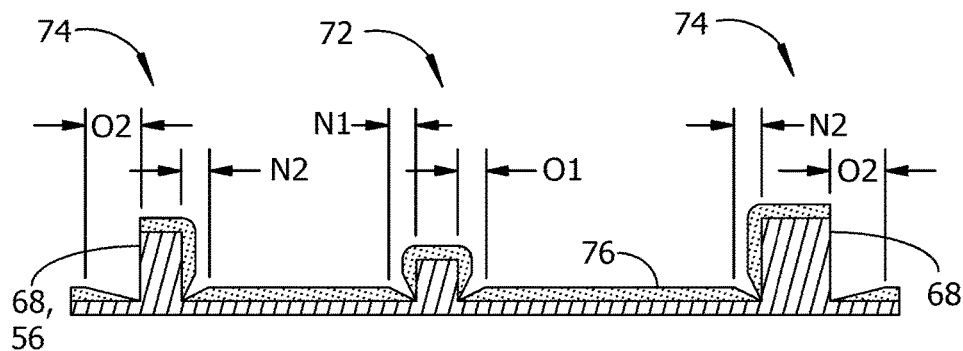
FIG. 16 shows another alternative cross-sectional view B-B, illustrating more examples of asymmetry.

FIG. 15 shows an example of asymmetry in which thin film thickness near a feature close to the outer edge of a wafer is not equal to thin film thickness near a feature toward the center of the wafer. Such a condition may occur even when thin film thickness is symmetric on all sides of features close to the center of the wafer. FIG. 16 shows an example of asymmetry that is severe enough that a thickness of a thin film is much less than the preferred thickness, or possibly entirely absent, from some facets 68. Wafers with the asymmetry conditions shown in FIGS. 15-16 may have poor operational reliability or may fail qualification testing. FIGS. 15-16 represent conditions which may occur when oscillatory motion of the planetary arm is halted but wafer processing continues with wafer rotation at a selected tilt angle. Operating an embodiment with a stationary planetary arm, that is, a planetary arm not undergoing oscillatory motion along an arcuate path, produces asymmetric thin film structures comparable to those produced with previously known wafer processing systems.

Figure 17A:
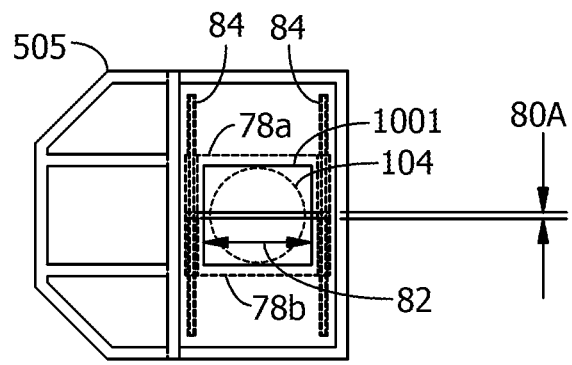
FIGS. 17A to 17C show an example of an alternative embodiment of a slit support plate fitted with an adjustable slit apparatus.
Figure 17B:
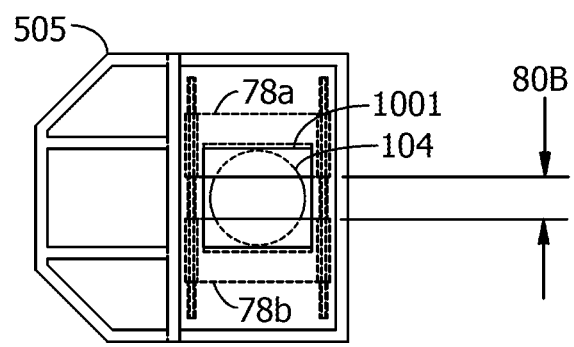
Figure 17C:
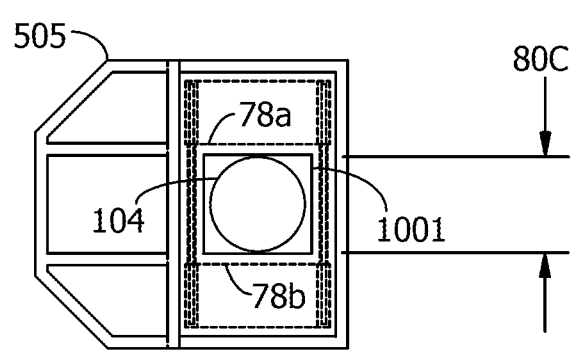

Previous examples of a slit were shown with fixed length and width dimensions. In an alternative embodiment, a slit may have an adjustable width dimension, as suggested in FIGS. 17A-17C. FIG. 17A shows a slit support plate 505 fitted with slides 84 holding a pair of opposing shutter plates (78*a*, 78*b*). Opposing edges of the shutter plates may be positioned to form a slot of adjustable width. For example, the shutter plates may be separated to form a slit with a narrow width 80A as in FIG. 17A, a slightly greater width 80B as in FIG. 17B, and opened to a maximum width 80C as in FIG. 17C. In the example of FIGS. 17A-C, a slit length 82 corresponds to a length of the beam aperture 1001. The slit length 82 may optionally be greater than a diameter of the wafer 104.

Figure 18A:
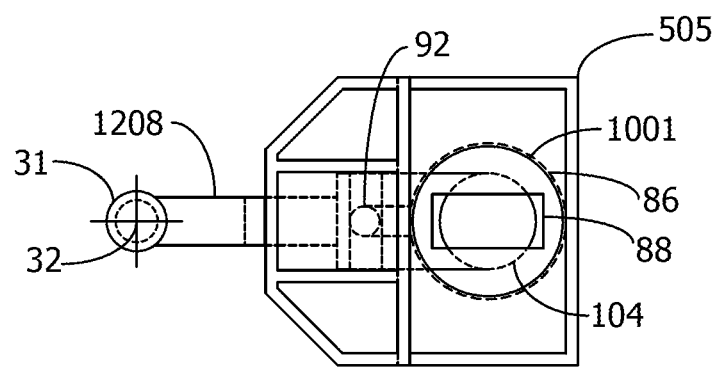
FIGS. 18A and 18B show an example of an alternative embodiment of a slit support plate fitted with a rotatable shutter plate with a rectangular slit formed in the plate.
Figure 18B:
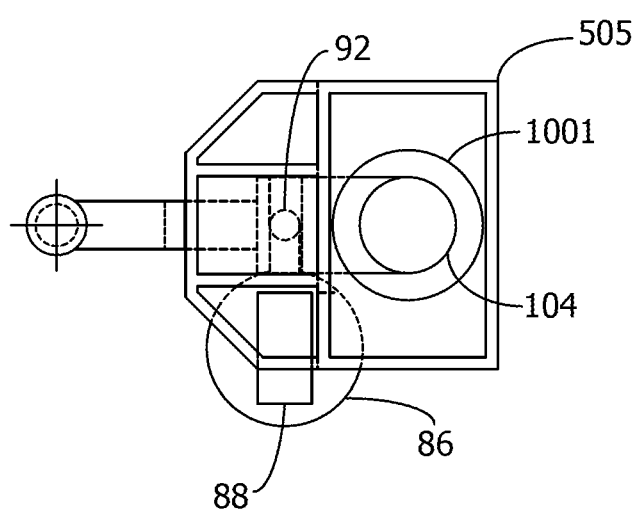

A slit 88 may alternatively be formed in a movable shutter plate as shown in the example of FIGS. 18A-18B. A planetary arm 1208 is partly visible behind the slit support plate 505. A shutter plate 86 is rotatably coupled to the slit support plate 505 by an actuator 92. The actuator may rotate the shutter plate to position the slit 88 in a larger beam aperture 1001 formed in the slit support plate as shown in FIG. 18A, or may rotate the shutter plate away from the beam aperture 1001 to expose the entire surface of the wafer 104 to a beam as suggested in FIG. 18B.

Figure 19:
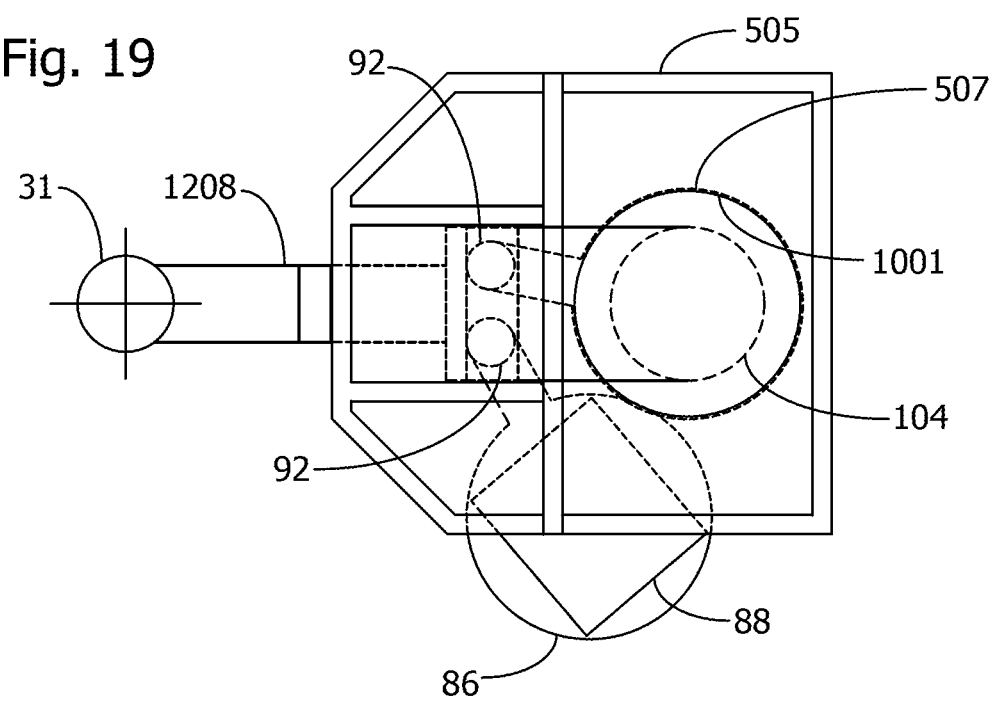
FIG. 19 shows an example of an alternative embodiment of a slit support plate having a rotatable shutter plate and a rotatable auxiliary wafer shutter.
Figure 20:
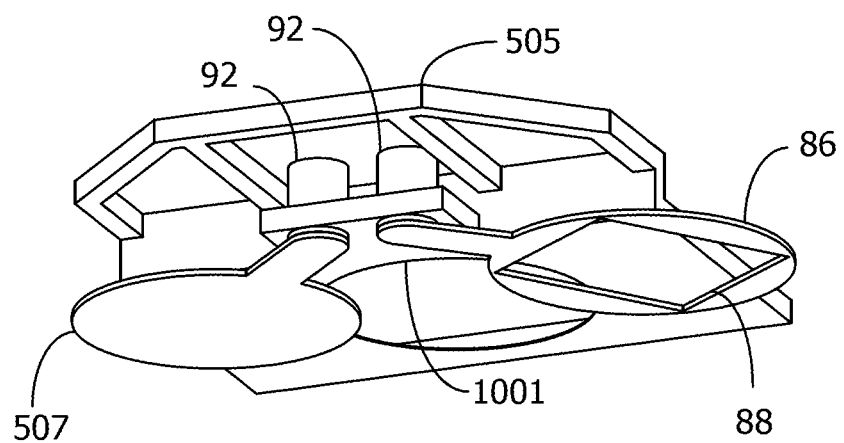
FIG. 20 shows a view toward the bottom side of the slit support plate and rotatable shutter plates of FIG. 19.

FIGS. 19-20 show examples of a slit support plate 505 having two shutter plates, each shutter plate with its own actuator 92. A first shutter plate 86 may be formed with a slit 88. A second shutter plate 507 may be formed without any aperture and may be positioned to completely block a beam from passing through a beam aperture 1001 in the slit support plate.

Figure 21A:
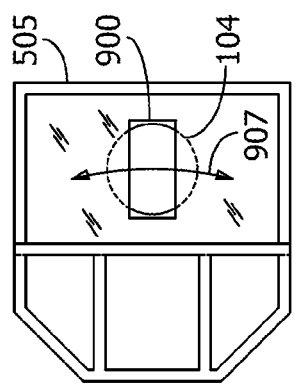
FIGS. 21A to 21F show examples of alternative aperture shapes for a slit support plate.
Figure 21B:
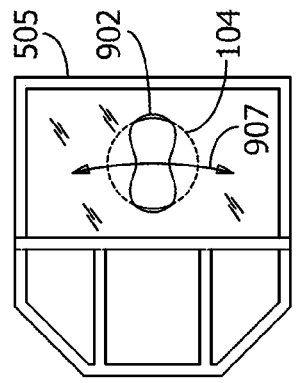
Figure 21C:
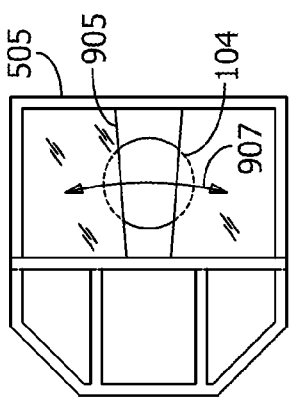
Figure 21D:
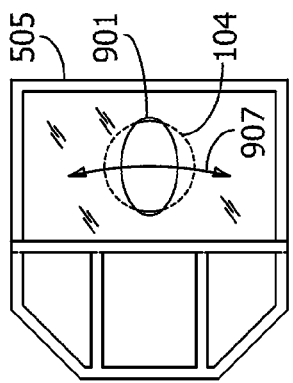
Figure 21E:
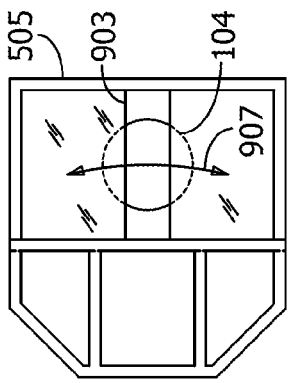
Figure 21F:
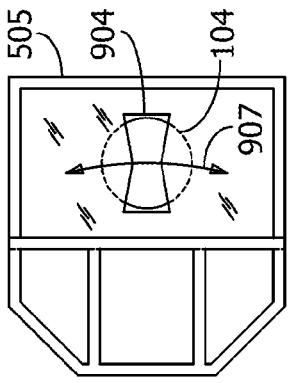

In each of the previous examples, a slit has a generally rectangular shape. In alternative embodiments, a slit may have other shapes as suggested in FIGS. 21A-21F. Slit shapes suitable for use with an embodiment include, but are not limited to, a rectangular slit 900 (FIG. 21A), a "figure-eight" slit 902 (FIG. 21B) with arcuate edges, a slit with nonparallel straight edges 905 (FIG. 21C), an obround or elliptical slit 901 (FIG. 21D) with arcuate edges, a rectangular slot with length much greater than width 903 (FIG. 21E), and a dual-trapezoid or "bowtie" slit 904 (FIG. 21F). Any of these slit shapes may alternatively be formed in a shutter plate or in the slit support plate.

Figure 22:
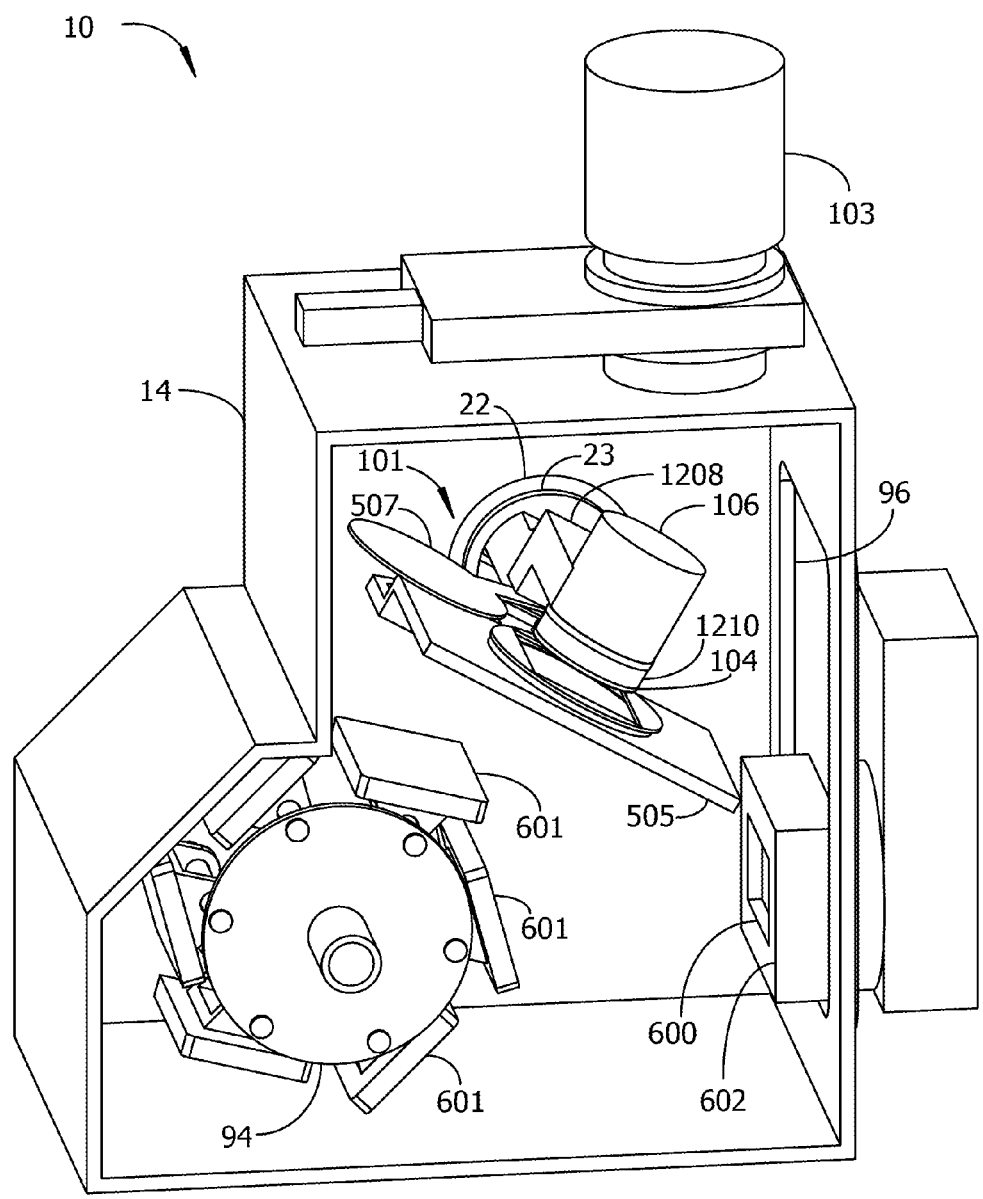
FIG. 22 is a pictorial view of an alternative embodiment having targets mounted on a rotatable drum.

The wafer processing machine in the example of FIG. 3 includes round targets for supplying deposition material on a carousel having a vertical axis of rotation. In an alternative embodiment, rectangular targets 601 may be placed on a rotatable drum 94 have a generally horizontal rotation axis, as suggested in FIG. 22. FIG. 22 further illustrates an example of a wafer processing machine adapted for performing deposition and etching. For deposition, an ion beam from the output stage 602 is incident upon a selected target 601, causing target material to be deposited on the wafer 104 attached to the planetary scan wafer stage 101. For etching, the output stage 602 may be repositioned along a channel 96 to direct a beam at the wafer 104 instead of the targets 601, and the planetary scan wafer stage 101 is rotated so the wafer holder and the wafer it holds face toward the ion beam at a selected tilt angle. The output stage 602 may be provided with a rectangular aperture 600 and focusing grids (not illustrated) to focus an output beam with a rectangular cross section to a line image 46 as shown in the example of FIG. 7.

Figure 23:
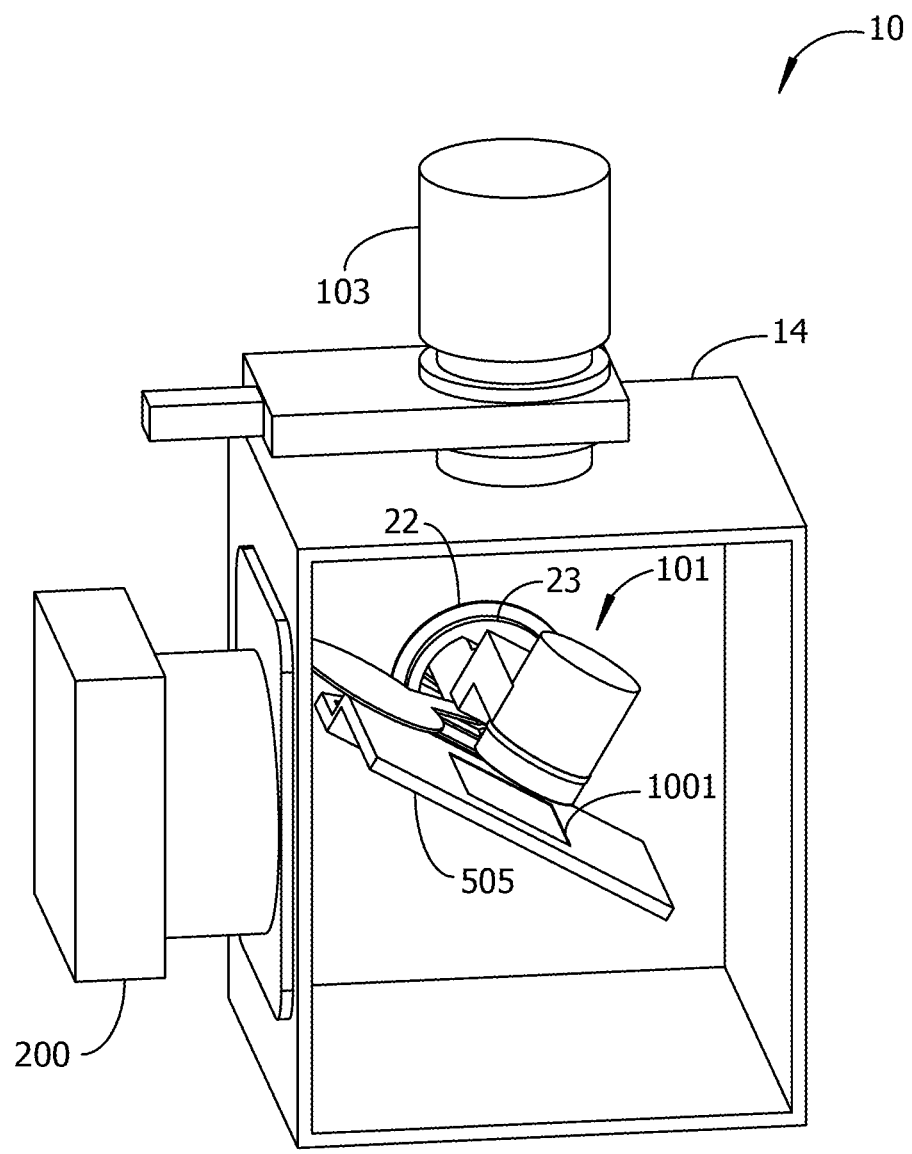
FIG. 23 is an example of an embodiment arranged for performing etching operations on a wafer attached to the scanning stage.

FIG. 23 shows an example of an alternative embodiment of a wafer processing machine adapted for wafer etching. In the example of FIG. 23, an ion source 200 outputs an ion beam directly at the planetary scan wafer stage 101.

Unless expressly stated otherwise herein, ordinary terms have their corresponding ordinary meanings within the respective contexts of their presentations, and ordinary terms of art have their corresponding regular meanings.

What is claimed is:

1. A planetary scan wafer stage, comprising:
   a tilt actuator;
   a planetary arm rotatably coupled to said tilt actuator;
   a slit support plate attached to said tilt actuator;
   a wafer holder rotatably coupled to said planetary arm; and
   a planetary scan actuator attached to said tilt actuator and to said planetary arm,
   wherein said planetary arm and said slit support plate are rotatable to a selected tilt angle by said tilt actuator and said planetary arm is movable along an arcuate path by said planetary scan actuator.

2. The planetary scan wafer stage of claim 1, further comprising a wafer rotation drive attached to said planetary arm, wherein said wafer rotation drive is coupled to said wafer holder for rotation of said wafer holder.

3. The planetary scan wafer stage of claim 1, wherein said arcuate path is a circular arc of constant radius.

4. The planetary scan wafer stage of claim 1, wherein an oscillatory motion of said planetary arm along said arcuate path and a rotational motion of said wafer holder are capable of coordinated rotation for symmetric processing of thin film structures on a wafer workpiece held in said wafer holder.

5. The planetary scan wafer state of claim 1, wherein said tilt actuator comprises a stationary collar and a core rotatably coupled to said stationary collar.

6. The planetary scan wafer stage of claim 5, wherein said planetary arm further comprises an arm hub rotatably coupled to said core.

7. The planetary scan wafer stage of claim 5, wherein said planetary scan actuator is attached to said core.

8. The planetary scan wafer stage of claim 5, wherein said slit support plate is attached to said core.

9. The planetary scan wafer stage of claim 5, further comprising a tilt actuator motor attached to said collar and disposed to drive said core in rotation relative to said collar.

10. The planetary scan wafer stage of claim 1, wherein said slit support plate is formed with a beam aperture.

11. The planetary scan wafer stage of claim 10, wherein said beam aperture is formed with a length greater than a diameter of a wafer held in said wafer holder.

12. The planetary scan wafer stage of claim 10, further comprising a pair of opposing shutter plates slidably coupled to said slit support plate, wherein a separation distance between opposing edges of said opposing shutter plates is adjustable to form a slot of adjustable width.

13. The planetary scan wafer stage of claim 10, further comprising a first shutter plate rotatably coupled to said slit support plate.

14. The planetary scan wafer stage of claim 13, wherein said first shutter plate is formed with an aperture for admittance of a beam of particles.

15. The planetary scan wafer stage of claim 13, wherein said aperture formed in said first shutter plate is formed with a rectangular shape.

16. The planetary scan wafer stage of claim 13, wherein said aperture formed in said first shutter plate is formed with arcuate edges.

17. The planetary scan wafer stage of claim 13, wherein said aperture formed in said first shutter plate is formed with opposing edges which are not parallel to one another.

18. The planetary scan wafer stage of claim 13, further comprising an actuator coupled to said slit support plate and said first shutter plate.

19. The planetary scan wafer stage of claim 13, further comprising a second shutter plate sized to block said beam aperture in said slit support plate.

20. The planetary scan wafer stage of claim 19, further comprising an actuator coupled to said slit support plate and said second shutter plate.

* * * * *